United States Patent [19]

Palkuti

[11] Patent Number: 4,575,676

[45] Date of Patent: Mar. 11, 1986

[54] METHOD AND APPARATUS FOR RADIATION TESTING OF ELECTRON DEVICES

[75] Inventor: Leslie J. Palkuti, Sunnyvale, Calif.

[73] Assignee: Advanced Research and Applications Corporation, Sunnyvale, Calif.

[21] Appl. No.: 481,772

[22] Filed: Apr. 4, 1983

[51] Int. Cl.[4] ................... G01R 31/26; G01R 31/02
[52] U.S. Cl. ............................ 324/158 R; 324/158 F
[58] Field of Search ........... 324/158 D, 158 F, 158 R, 324/73 R

[56] References Cited

U.S. PATENT DOCUMENTS 3,437,929  4/1969  Glenn ............................. 324/158 R
4,287,473  9/1981  Sawyer ........................... 324/158 R

OTHER PUBLICATIONS

"The Use of an Industrial X-Ray Source for Electronic Component Radiation Effects Work", Leonard Adams & Iam Thompson, *IEEE Transactions on Components, Hybrids, and Manufacturing Technology*, vol. CHMT-3, No. 1, Mar. 1980.

*Primary Examiner*—Ernest F. Karlsen

[57] ABSTRACT

A test apparatus for electron devices, such as integrated circuits, at the wafer stage of fabrication, wherein a beam of ionizing radiation is directed through an electrical probe card and onto the wafer under test. The probe card and the radiation beam share a common port through which a selected device or group of devices is exposed, but other devices on the wafer are not similarly exposed. A microscope, supported on a frame, is interchangeable with the radiation beam source, sharing the common port, so that a tested device may be observed.

18 Claims, 5 Drawing Figures

METHOD AND APPARATUS FOR RADIATION TESTING OF ELECTRON DEVICES

DESCRIPTION

1. Technical Field

The invention relates to combined non-destructive and destructive testing of electronic devices and, in particular, to testing of semiconductor devices by ionizing radiation, particularly Xrays, as well as by an electrical probe.

2. Background Art

Modern electronic devices frequently combine adjacent layers of semiconductor material, dielectric material and metal. Such devices are frequently needed and used in harsh environments, such as regions where ionizing radiation might be encountered. For this reason, performance of electronic devices under ionizing radiation flux must be tested and compared to specifications.

Ionizing radiation creates electron-hole pairs in materials. At dielectric-semiconductor interfaces, ionizing radiation leads to trapped charges and interface states that change the device characteristics. In bipolar transistors, trapped charges and interface states at the silicon-passivation-layer interface lead to reduced gain and increased leakage current. In MOS transistors, ionizing radiation leads to changes in the device current-voltage characteristics and increased leakage currents.

In the past, radiation testing of electronic devices, such as integrated circuits, has been accomplished using sources of high-energy penetrating radiation, such as cobalt 60, requiring large amounts of lead shielding and a radiation facility license. Sometimes testing was carried out in an underground protective vault where high-dose isotopic sources were located. Typically, samples of finished and packaged devices were transported from a production line to the test location and then returned. The inconvenience of such transportation and the expense of packaging and testing devices that are later found not to meet radiation specifications has created a need for a testing method and apparatus which is more suited to a production line. Apart from mere inconvenience, remotely located irradiation facilities frequently do not provide an opportunity for varied types of testing in addition to the application of electrical power to the devices during radiation exposure.

An object of the invention was to devise a radiant energy test method and apparatus for the radiation testing of electronic devices, particularly semiconductor devices, which method and apparatus is suited to a production line where electrical testing also takes place.

DISCLOSURE OF INVENTION

The above object has been met with a test apparatus for electronic devices, such as integrated circuits, at the wafer stage of fabrication, wherein a beam of ionizing radiation is directed through an electrical probe card and onto the wafer under test. The probe card and the radiation beam share a common port through which a selected device or group of devices is exposed, but other devices on the wafer are not similarly exposed.

The source is preferably an X-ray source, but a laser, isotope or other source of ionizing radiation may be used. The probe card supports an auxiliary board which, in turn, supports an auxiliary collimator, axially aligned with a principal collimator of the radiation source. The auxiliary collimator provides an aperture through the auxiliary board for radiation to pass. A similar aperture in the probe card allows the radiation to reach only a limited area during radiation testing. If the target is a wafer, the radiation beam cross section, as well as the beam exposure port through the card and the collimators, are limited by the collimators to a cross sectional size which exposes only a single integrated circuit die to the beam or, if desired, a group of die. A wafer is supported on a chuck, laterally movable in X and Y directions, so that a selected number of individual integrated circuit die on the wafer may be tested. A microscope is supported on a frame to be interchangeable with the radiation source so that the tested device may be observed through the beam exposure port.

The test procedure involves testing each integrated circuit on a wafer electrically using the probe card for standard electrical measurements. A few individual circuits are selected for radiation testing. These are exposed to the beam of ionizing radiation while under electrical power from the probe card. Wires extending from the card to the device derive measurement information regarding device performance and characteristics until failure, if such occurs.

The present invention is suited to an integrated circuit production line because the ionizing radiation beam is of low energy, thus only limited shielding is required. The combination of electrical probe testing and radiation testing simplifies the production line testing operation.

BEST MODE FOR CARRYING OUT THE INVENTION

The present invention is especially adapted for the testing of wafers, having semiconductor integrated circuits fabricated thereon, while such wafers are still in a production line. Typically, such a wafer will have many identical integrated circuits, each approximately one quarter inch on a side. The apparatus of the present invention allows non-destructive electrical testing, plus combined radiation and electrical testing.

Figure 1:
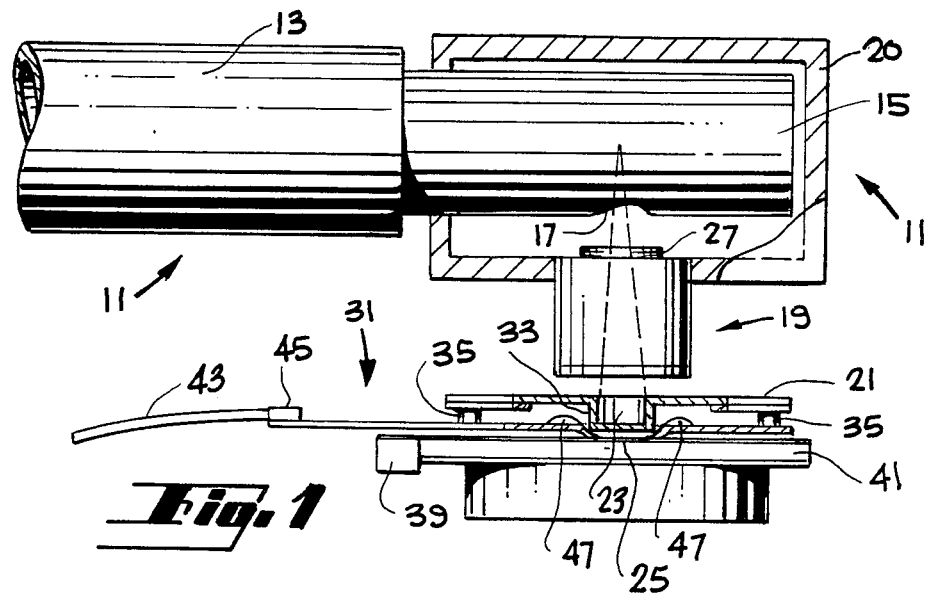
FIG. 1 is a partially cut-away, close up view of a source of ionizing radiation over an electrical test fixture and a target electron device for testing.

With reference to FIG. 1, an X-ray tube assembly 11 is seen having a tube base 13 enclosing a filament, and a tune anode assembly 15 enclosing a target. Anode assembly 15 has a window 17 through which Xrays pass into a collimator 19. Anode assembly 15 is enclosed in a radiation blocking housing 20. The only exit for radiation is through an aperture with shutter 27 that can be opened and closed to either pass or cut off the radiation beam. While an X-ray tube is shown, other sources of radiation may be used, including light sources or isotopic radiation sources. Collimator 19 includes materials selected to minimize scattering of Xrays and maximize beam collimation.

Electrical testing is carried out by means of a known probe card 31 modified for X-ray testing by means of an auxiliary collimator 33 mounted on an auxiliary shield 21 by means of spacers 35. The probe card is used to provide mechanical support for auxiliary shield 21, in turn supporting auxiliary collimator 33. Auxiliary shield 21 is typically a metallic planar member supported about one to two centimeters above probe card 31 in a parallel plane. Auxiliary collimator 33 is generally tubular, having a centrally defined port 23 receiving a radiation beam from collimator 19 and delivering it to an electron device such as an integrated circuit on a wafer 25 immediately below the lower exit aperture of the port. The beam port or aperture through the center of the auxiliary collimator limits the beam cross sectional area to an area corresponding to an electronic device to be irradiated. The wafer 25 is supported on a chuck 41 having a dosimeter 39 on its periphery. Dosimeter 39 is preferably a solid-state detector, such as a PIN diode, giving an instantaneous read out of radiation flux in the path of the beam. Such placement is possible because the chuck 41 is movable in the X-Y plane.

Probe card 31 receives power from a cable 43 connected to card 31 by means of a cable terminator 45 which matches power and signal wires in the cable to printed wires on the card 31. In turn, these printed wires lead toward a central aperture in the card 31 where wire probes 47 make electrical contact with wafer 25 through a central aperture in the card 31.

The position of wafer 25 may be shifted by lowering wafer chuck 41 then translating it in the X and Y direction. The shutter is closed during wafer translation such that unselected devices are not irradiated. One instance in which such translation must occur is for use of dosimeter 39. In order to check the radiation flux, wafer chuck 41 is lowered and dosimeter 39 is moved so that it is directly in line with the radiation beam emerging from window 17. Once calibration or radiation flux measurements are complete, the chuck 41 is translated so that a desired integrated circuit can be exposed by the beam.

Figure 2:
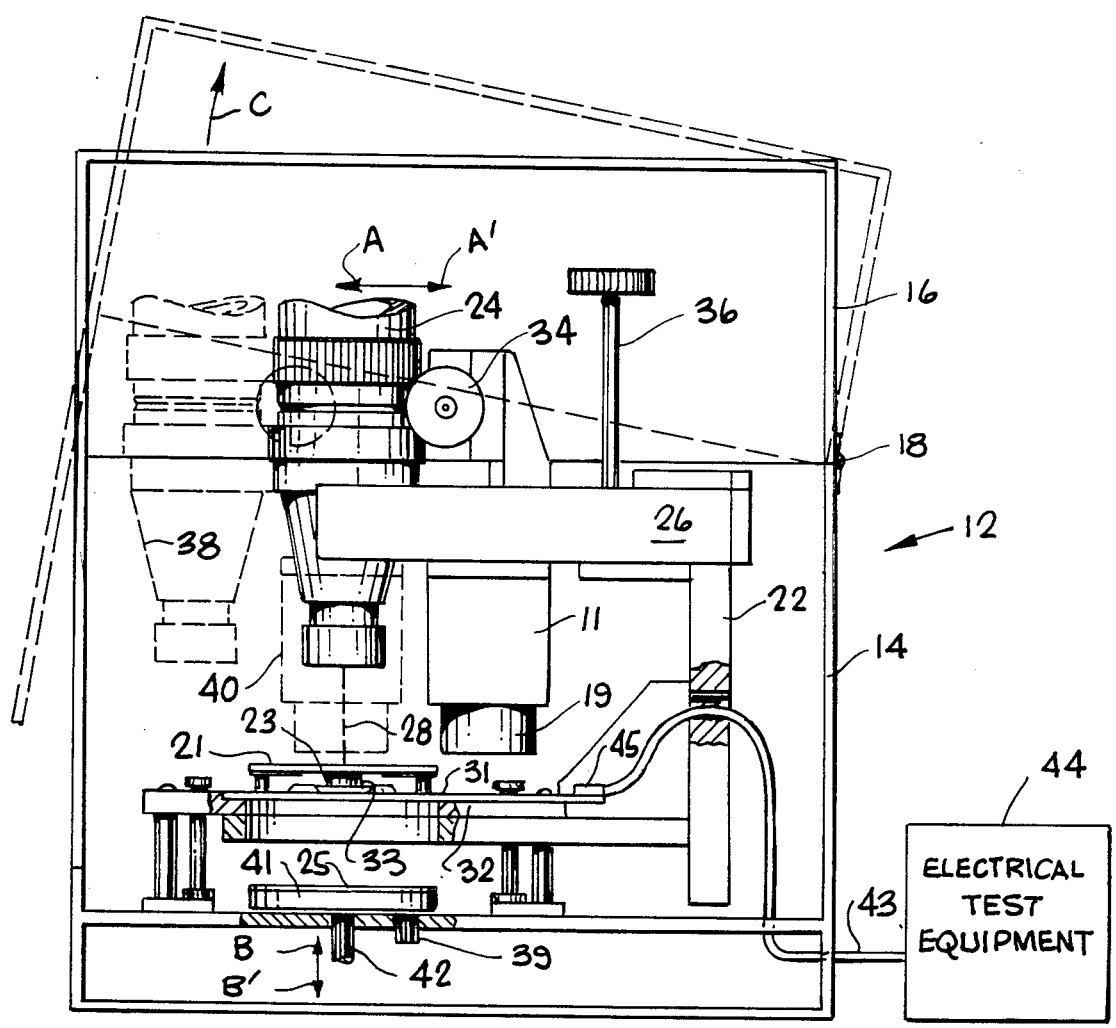
FIG. 2 is the side cut-away view of an enclosure housing the test apparatus of the present invention.

With reference to FIG. 2, a cabinet 12 is shown having a lower portion 14 and an upper portion 16 connected to the lower portion at a hinge 18. Cabinet 12 houses a framework 22 which supports the X-ray tube assembly 11 as well as a microscope 24 on a transverse rail 26. Microscope 24 is shown directly over auxiliary shield 21 having collimator 33. Both the microscope 24 and the X-ray tube assembly 11, seen in an end view, are movable so that the radiation axis 28 corresponds with the center of port 23 within the auxiliary collimator. The wafer support 41 is shown in a retracted or down position. In normal operation, this support would be raised so that a wafer and dosimeter 39 would be directly beneath probe card 31 and probe card support member 32. In the position shown, the focus of microscope 24 can be adjusted by focusing knob 34 and the position of the microscope can be locked in place by a clamping screw 36. When clamping screw 36 is released, microscope 24 may be moved in the direction indicated by arrowhead A until the microscope achieves the position indicated by the dashed lines 38. Since the microscope is connected to X-ray tube assembly 11, the X-ray tube will assume the interchanged position indicated by the dashed line 40. In that position, the tube collimator 19 will be directly above port 23 and only millimeters away from a wafer or other electron device on support 41 when the support is in the fully raised position achieved when piston 42 moves in the direction indicated by arrow B.

The X-ray tube operates in the range of 25 to 60 kilovolts with a maximum power of approximately 3.5 kilowatts. The X-ray tube is slightly inclined with the horizontal axis approximately 5°, in order to achieve a uniform X-ray exposure area. The X-ray beam passes through approximately 10 cm. of air and about 0.15 mm. of aluminum, placed just below the shutter if desired, before reaching the target. The optional aluminum filter is provided to condition the X-ray beam for more accurate dosimetry. The desired dose rate is in the range of $10^1$ to $10^5$ rads (Si) per minute when the X-ray tube is operating at the above mentioned voltages. At $10^5$ rads (Si) per minute dose rate, very fast operation is possible so that on-line automatic radiation testing of individual semiconductor die, including very large scale integrated circuits is possible.

Electrical power to a wafer is supplied by electrical test equipment 44 which communicates with a device under test via cable 43 which enters cabinet 12 at a low region to avoid radiation leakage to operators. The cable then penetrates framework 22 at a high region and is connected to probe card 31 at terminator 45. Cabinet 12 is made of lead-lined aluminum. A lead foil having a thickness of 0.120 inches is sufficient to block radiation from the source of the type used herein. When the shutter 27 is to be opened, the cabinet is closed in the position shown in FIG. 2. When the shutter 27 is closed, the cabinet door may be opened by lifting upper portion 16 in the direction indicated by arrow C.

Figure 3:
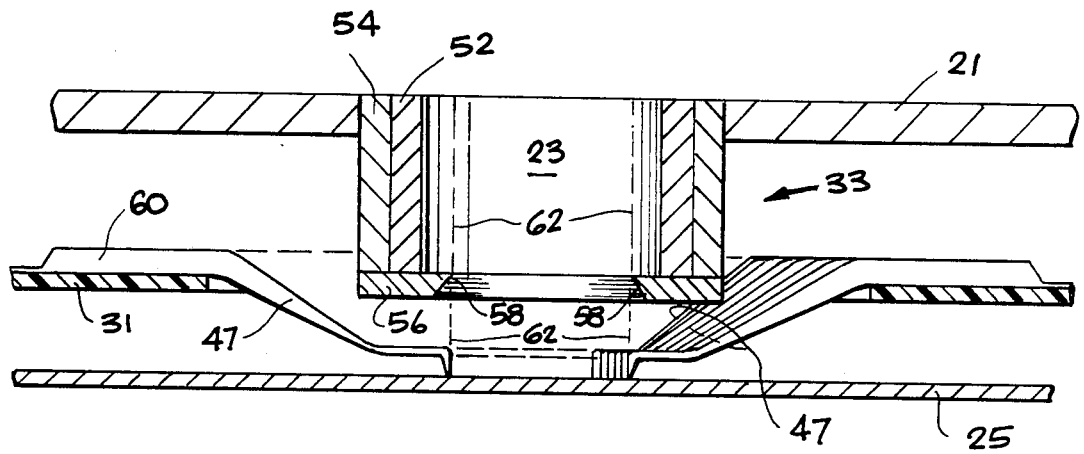
FIG. 3 is a detail of an auxiliary collimator mounted above an electrical test fixture shown in FIGS. 1 and 2.

FIG. 3 shows a detail of the auxiliary collimator 33 which is supported by auxiliary shield 21. Auxiliary shield 21 consists of a brass plate about 5 mm thick that is sufficient to block the X-ray beam. The auxiliary collimator 33 has an inner aluminum tube 52 coaxially surrounded by an outer tin-lead alloy tube 54. Tube 52 is considerably thinner than tube 54, with exact dimensions not being critical. A tantalum base 56, approximately 20 mils in thickness, is secured to the bottom of the two tubes. The materials for the tubes 52 and 54, as well as base 56, are selected to have low radiation scattering cross sections which reduce secondary radiation from scattering, either directly from the source or backscatter from materials on which radiation impinges. Tantalum base 56 has a lower knife-edge defining an exit port 58 to reduce radiation scattering.

Probe card 31 carries printed circuit wires which are terminated by means of soldered connections 60 with tapered conductive probes 47 which are very fine tungsten wires for interconnection with the contact pads of the integrated circuit on wafer 25. In operation, a radiation flux will travel down port 23, between dashed lines 62 and fall onto the integrated circuit die being contacted by the probes 47. The collimated beam cross section, as well as the spacing between the probes 47, corresponds to the size of the device being tested. It is important that the area of the beam not exceed the area of the device since exposure of other devices is not desired.

Figure 4:
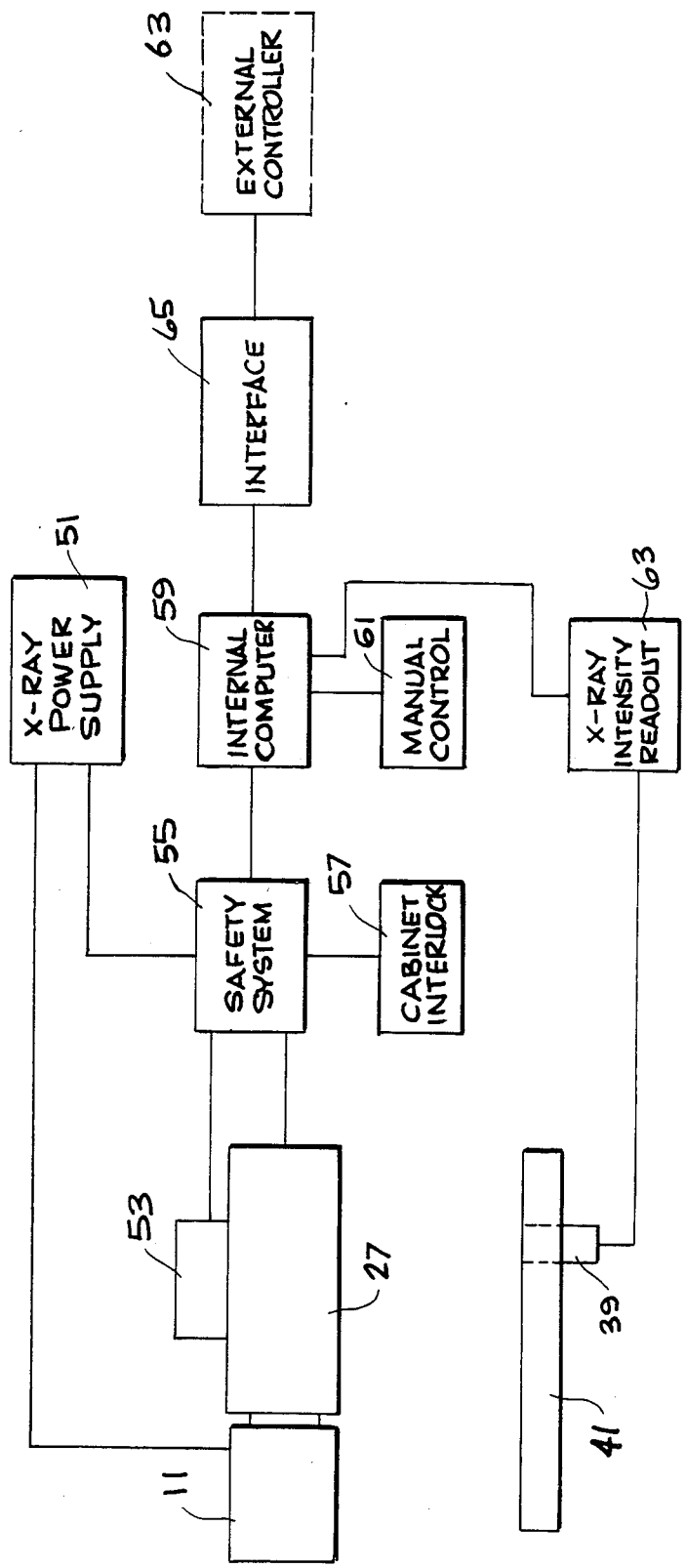
FIG. 4 is a block diagram of a control system for the present invention.

With reference to FIG. 4, a microprocessor 59 operated control system for the present invention includes a power supply 51 which is connected to the X-ray tube in X-ray tube assembly 11. When power is applied to the system, the tube operates continuously. However, emission of X-rays through the collimator is controlled by shutter 27. Only when the shutter is open is there any radiation flux outside of the X-ray tube. Accordingly, it is important to monitor the shutter position. A shutter position sensor 53, which may be one or more switches, is provided to monitor the shutter position. The shutter position sensor is connected to safety system 55, a number of logic gates which, among other tasks interprets the position of the switches forming the shutter position sensor 53. The safety system also takes into account whether the cabinet is open or closed. This is done by means of another series of switches which form cabinet interlock 57. The shutter normally blocks the beam except when the protective interlock switches, including cabinet switches, are in the safe position. The logic of safety system 55 communicates with the internal microprocessor 59 which can disable power supply 51 in the event that safety system 55 indicates that an unsafe condition exists. For test and maintenance purposes, manual controls 61 are also provided. These controls may also be used to set exposure duration, power levels, and other parameters. Microprocessor 59 can communicate with an external controller 63, such as a master production computer for providing status or other information. Such communication may be over a standard interface 65. Such a standard interface and bus would preferably be an IEEE 488 bus with driving circuits.

While the radiation dose may be predicted by the power levels applied by the tube and the duration of shutter opening, it is also necessary to monitor the actual dose rate. This is done by means of dosimeter 39 carried on the chuck 41. The dosimeter 39, such as a PIN diode, communicates with an intensity read-out device 63 which communicates with computer 59 and safety system 55. So long as the measured dose rate corresponds to an expected dose rate, within preset limits, the system may proceed to operate. If the extent of radiation measured by the dosimeter exceeds or drops below expected values of radiation, a fault condition is indicated and the system may be shut down if desired.

Figure 5:
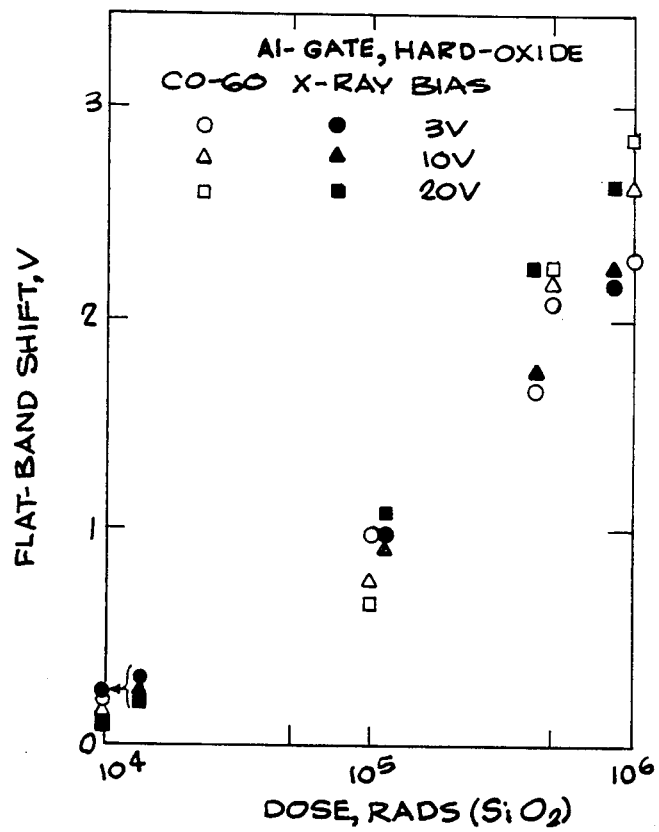
FIG. 5 is a plot correlating results between the X-ray source and a cobalt-60 irradiation exposure where aluminum-gate MOS devices were tested.

FIG. 5 illustrates the correspondence between an X-ray source and a cobalt 60 source. From the plot it is seen that for these aluminum-gate MOS devices, the flat-band voltage shift of the transistor is nearly identical over the measured dose range from $10^4$ to $10^6$ rads ($SiO_2$). The correlation between cobalt 60 and Xrays was equally good for bias voltages from 3 to 20 volts during irradiation.

The usual procedure is to electrically test each of the die on the wafer. However, only a few of the die are tested under an ionizing radiation flux. These die are brought under the radiation flux which emerges from the auxiliary collimator. The cross sectional area of the flux as it emerges from the auxiliary collimator corresponds to the size of the die. In this manner, only the selected die is exposed to ionizing radiation and the remaining die on a wafer are not so exposed. Electrical power is applied to the die through the probes to pads on the test device prior to the time that the shutter is opened, exposing the device to the ionizing radiation flux. Electrical parameters are monitored and recorded so that the failure limits of the device can be compared with specifications.

I claim:

1. A test apparatus for electronic devices comprising,
    means for supporting an electronic device, said electronic device partially formed of silicon dioxide,
    a source of radiation having a collimated beam, said radiation having an energy which is ionizing to silicon dioxide, causing permanent degradation of electrical characteristics of said electronic device, said source mounted above said device supporting means,
    an electrical probe means for applying electrical power to said electronic device and communicating device performance date outwardly, said probe means located between said device supporting means and said beam source, said probe means having fine electrical wires contacting said electronic device, said probe means having an auxiliary collimator with an aperture defined therein for transmitting the beam to the electronic device under test.

2. The apparatus of claim 1 wherein said means for supporting an electronic device is a chuck movable in X and Y directions.

3. The apparatus of claim 1 wherein said source of ionizing radiation causing electronic device degradation is selected from the group consisting of an X-ray tube, a short-wavelength laser source or an isotopic radiation source.

4. The apparatus of claim 1 wherein said probe means is a probe card having an auxiliary shield supported in a parallel plane above the card, said auxiliary shield having an auxiliary collimator with a beam aperture of a size limiting the radiation beam cross-sectional area to the approximate size of an electronic device under test.

5. The apparatus of claim 4 wherein said auxiliary collimator comprises coaxial cylinders of materials having low radiation scattering cross sections with respect to the beam.

6. The apparatus of claim 1 wherein said means for supporting an electronic device has a calibrated dosimeter connected thereto for measuring the flux of ionizing radiation.

7. The apparatus of claim 1 having a radiation-tight cabinet enclosing said electronic device supporting means, said source of ionizing radiation and said electrical probe means.

8. The apparatus of claim 1 having a frame supporting said source of ionizing radiation in a movable manner, said frame having a microscope movably mounted thereon whereby the positions of said microscope and said radiation source are interchangeable.

9. The apparatus of claim 8 wherein said frame comprises an upright member supporting a transverse rail, said microscope and radiation source mounted for interchangeable movement on said rail.

10. The apparatus of claim 3 wherein a portion of said X-ray tube is enclosed in a housing surrounding a beam exit portion of the tube, said housing having a primary beam collimating means directing the beam onto the electron device under test.

11. A semiconductor test apparatus comprising,
    a means for supporting a semiconductor wafer,
    said wafer partially formed of silicon dioxide,
    a radiation source having an energy which is ionizing to silicon dioxide directing a collimated beam of ionizing radiation onto an auxiliary collimator, said auxiliary collimator having an aperture of dimensions corresponding to a semiconductor integrated circuit die of said wafer,
    an electrical test probe card for testing electrical characteristics of a semiconductor integrated circuit, said probe card mounted in proximity to said wafer support means, said support means and probe card both disposed beneath said auxiliary collimator, said probe card supporting the auxiliary collimator, the collimator defining an aperture therein through which said beam passes, means for simultaneously energizing said ionizing radiation source and said probe card for electrical testing of an integrated circuit during irradiation, and means for indexing said wafer support means to bring another integrated circuit die from said wafer into the path of said collimated beam.

12. The apparatus of claim 11 wherein said ionizing radiation source is selected from the group consisting of an X-ray tube source, a short-wavelength laser source or an isotopic radiation source.

13. The apparatus of claim 1 wherein said wafer support means includes a calibrated radiation dosimeter.

14. The apparatus of claim 11 wherein said wafer support means is movable in X and Y directions.

15. The apparatus of claim 11 having optical means supported above said probe card for viewing an integrated circuit chip through said auxiliary collimator.

16. The apparatus of claim 15 wherein said optical means and said radiation source are both mounted on a rail directly above said probe card, whereby either of said optical means and radiation source may be disposed directly above said probe card.

17. The apparatus of claim 16 wherein said optical means is a microscope.

18. The apparatus of claim 11 having a shutter in the path of said beam of radiation and having a radiation-tight housing enclosing said wafer supporting means, said electrical test probe card and said means for indexing said wafer support means, said housing having protective interlock switches connected to the shutter whereby the shutter normally blocks said beam except when said protective interlock switches permit shutter removal from the beam path.

* * * * *